United States Patent
Prisecaru et al.

(10) Patent No.: US 12,072,401 B2
(45) Date of Patent: Aug. 27, 2024

(54) EPR SPECTROMETER WITH AT LEAST ONE POLE PIECE MADE AT LEAST PARTIALLY OF A FUNCTION MATERIAL

(71) Applicant: Bruker BioSpin GmbH, Ettlingen (DE)

(72) Inventors: Ion Prisecaru, Karlsruhe (DE); Lukas Haenichen, Karlsruhe (DE)

(*) Notice: Subject to any disclaimer, the term of this patent is extended or adjusted under 35 U.S.C. 154(b) by 0 days.

(21) Appl. No.: 17/537,935

(22) Filed: Nov. 30, 2021

(65) Prior Publication Data

US 2022/0196775 A1 Jun. 23, 2022

(30) Foreign Application Priority Data

Dec. 22, 2020 (EP) .................... 20216685

(51) Int. Cl.
*G01R 33/383* (2006.01)
*G01R 33/38* (2006.01)
(Continued)

(52) U.S. Cl.
CPC ....... *G01R 33/383* (2013.01); *G01R 33/3806* (2013.01); *G01R 33/60* (2013.01); *H01F 7/202* (2013.01)

(58) Field of Classification Search
CPC .............. G01R 33/3806; G01R 33/383; G01R 33/56518; G01R 33/60; H01F 7/0278; H01F 7/202; G01N 24/10
See application file for complete search history.

(56) References Cited

U.S. PATENT DOCUMENTS

| 5,061,897 A | 10/1991 | Danby et al. |
| 5,124,651 A | 6/1992 | Danby et al. |

(Continued)

FOREIGN PATENT DOCUMENTS

| EP | 0752596 A2 | 1/1997 |
| GB | 2319844 A | 6/1998 |

(Continued)

OTHER PUBLICATIONS

Machine translation of WO 2022/128153, Huber, S. Jun. 23, 2022 (Year: 2022).*

(Continued)

*Primary Examiner* — Steven L Yeninas
(74) *Attorney, Agent, or Firm* — Benoît & Côté Inc.

(57) ABSTRACT

An electron paramagnetic resonance (EPR) spectrometer includes a magnet system comprising at least one magnet and at least one pole piece for producing a magnetic field along a pole axis in a field of view in front of the at least one pole piece. A probe head comprising a microwave resonator and at least one modulation coil or rapid scan coil produces an additional, time-varying magnetic field aligned along the pole axis. The probe head is arranged in the field of view, and a respective modulation coil or rapid scan coil is arranged between the microwave resonator and a respective pole piece. For each pole piece, at least a part of said pole piece is made of a function material having an electric conductivity $\sigma_f$ of $10^4$ S/m or less, and having a saturation magnetic flux density $BS_f$ of 0.2 T or more.

17 Claims, 7 Drawing Sheets

(51) Int. Cl.
*G01R 33/60* (2006.01)
*H01F 7/20* (2006.01)

(56) References Cited

U.S. PATENT DOCUMENTS

| | | | | |
|---|---|---|---|---|
| 5,166,619 | A * | 11/1992 | Ries | G01R 33/385 |
| | | | | 324/318 |
| 5,283,544 | A | 2/1994 | Sakurai | |
| 5,592,089 | A * | 1/1997 | Danby | G01R 33/383 |
| | | | | 324/318 |
| 5,675,256 | A * | 10/1997 | Young | G01R 33/383 |
| | | | | 324/318 |
| 5,680,086 | A * | 10/1997 | Allis | G01R 33/3873 |
| | | | | 324/318 |
| 5,731,704 | A * | 3/1998 | Schnur | G01R 33/389 |
| | | | | 324/319 |
| 5,864,275 | A * | 1/1999 | Ohashi | G01R 33/383 |
| | | | | 335/297 |
| 6,093,232 | A | 6/2000 | Sheinberg | |
| 6,111,410 | A * | 8/2000 | Young | G01R 33/3806 |
| | | | | 324/309 |
| 6,150,818 | A * | 11/2000 | Barber | H01F 7/202 |
| | | | | 324/319 |
| 6,346,813 | B1 * | 2/2002 | Kleinberg | G01V 3/32 |
| | | | | 324/303 |
| 6,348,275 | B1 | 2/2002 | DeCristofaro et al. | |
| 6,472,874 | B1 | 12/2002 | Chandrakumar et al. | |
| 2004/0041566 | A1 * | 3/2004 | Aoki | H01F 13/006 |
| | | | | 324/319 |
| 2005/0253585 | A1 * | 11/2005 | Xiao | G01R 33/3806 |
| | | | | 324/319 |
| 2006/0077027 | A1 * | 4/2006 | Aoki | G01R 33/383 |
| | | | | 335/306 |
| 2006/0267715 | A1 * | 11/2006 | Ni | G01R 33/383 |
| | | | | 335/297 |
| 2007/0131673 | A1 * | 6/2007 | Rapoport | G01R 33/3806 |
| | | | | 219/497 |
| 2008/0061782 | A1 * | 3/2008 | Usagawa | G01N 24/10 |
| | | | | 324/316 |
| 2010/0219833 | A1 * | 9/2010 | McGinley | G01R 33/383 |
| | | | | 324/318 |
| 2018/0340999 | A1 * | 11/2018 | Behzadnezhad | G01R 33/38 |
| 2019/0068008 | A1 * | 2/2019 | Gao | H02K 1/02 |
| 2021/0011106 | A1 * | 1/2021 | Breham | G01R 33/60 |

FOREIGN PATENT DOCUMENTS

| | | |
|---|---|---|
| JP | H02-218343 A1 | 8/1990 |
| JP | H04023411 A | 8/1990 |
| JP | H05288821 A | 11/1993 |
| JP | 2002090435 A | 3/2002 |

OTHER PUBLICATIONS

Jeschke Gunnar, "Einführung in die ESR-Spektroskopie, Ein Vorlesungsskript", 2006.

* cited by examiner

EPR SPECTROMETER WITH AT LEAST ONE POLE PIECE MADE AT LEAST PARTIALLY OF A FUNCTION MATERIAL

BACKGROUND OF THE INVENTION

Field of the Invention

The invention relates to an electron paramagnetic resonance (EPR) spectrometer, with:
a magnet system, comprising at least one magnet and at least one pole piece, preferably a pair of mutually opposing pole pieces, for producing a magnetic field in a field of view in front of the pole piece or between the pair of pole pieces, wherein said magnetic field is generated along a pole axis; and
a probe head, comprising a microwave resonator and at least one modulation coil or rapid scan coil for producing an additional, time-varying magnetic field aligned along the pole axis, wherein the probe head is arranged in the field of view, and wherein a respective modulation coil or rapid scan coil is arranged between the microwave resonator and a respective pole piece.

Description of the Related Art

Such an EPR spectrometer is known from Gunnar Jeschke, lecture script "Einführung in die ESR-Spektroskopie", Konstanz (DE) 1998 and 2006, page 88, FIG. 4-2.

Electron paramagnetic resonance (EPR) spectroscopy is a powerful tool for investigating samples having a paramagnetic magnetic moment, in particular having unpaired electrons. In EPR spectroscopy, the sample is typically subjected to microwave radiation (also called B1 field) with a constant frequency inside a microwave resonator, and a background magnetic field (also called B0 field) generated by a magnetic system is swept. A probe head comprising the microwave resonator with the sample is exposed to said background magnetic field. Since the sweep of the background magnetic field is rather slow, the background magnetic field is also referred to as "static" magnetic field. The absorption of microwaves by the sample is measured and used for characterizing the sample, in particular with respect to its chemical state and molecular environment.

Continuous wave (CW) and rapid scan (RS) EPR methods furthermore apply a periodically changing magnetic field, named modulation field ($B_{mod}$) and rapid scan field ($B_{RS}$) respectively, typically with frequencies between 5 kHz and 100 kHz. This changing magnetic field (also called time-varying magnetic field) is superimposed to and collinear with the background magnetic field. The changing magnetic field is typically generated by a set (pair) of coils, called modulation coils or rapid scan coils, respectively, which are placed symmetrically between the microwave resonator and pole pieces of the magnetic system, between which the background magnetic field is generated in a field of view.

The changing magnetic field may improve the EPR measurement. For example, the role of the modulation field $B_{mod}$ is to increase the signal to noise ratio of EPR measurements by shifting both the source and detection sub-systems from 0 Hz operation point (region of shot noise) higher up, typically at 5 kHz up to 100 kHz (thermal noise region), hence reducing the phase noise levels and consequently dramatically increasing the signal to noise ratio of the send and receive system. G. Jeschke, see above, discloses an EPR spectrometer comprising a pair of modulation coils attached to a microwave resonator, arranged in a field of view of a magnet system comprising two magnets having a field of view between two pole pieces. Further, U.S. Pat. No. 6,472,874 discloses an EPR imaging device comprising modulation coils.

The pole pieces of the magnet system are generally used to direct and shape the background magnetic field for the EPR experiment; generally a good homogeneity and also a strong magnetic field strength are desired for the background magnetic field in the field of view. The standard material for a pole piece is iron.

However, arranging a modulation coil or rapid scan coil adjacent to such a pole piece, when operating the modulation or rapid scan coil, can induce circular electric currents in the electrically conducting pole piece. These so-called eddy currents generate a magnetic field opposed to the variation of magnetic field generated by the modulation coils, in effect lowering their efficiency as well as their inductance. Accordingly, an increased power input into the modulation coils or rapid scan coils is required to generate the desired magnetic field strength of the time-varying magnetic field.

As a side effect, when the power input at the modulation coils or rapid scan coils has to be increased, this can also increase eddy currents in the wall of the microwave resonator. The AC type eddy currents in the walls of the microwave resonator interact with the background magnetic field and may contribute to acoustic vibrations of the walls of the microwave resonator. Further, the stronger electric currents in the modulation coils also lead to stronger interaction with the background magnetic field, which contributes to acoustic vibrations of the modulation coils. These combined vibrations may lead to a detuning of the microwave resonator which, in turn, can cause noise in the EPR experiment.

Furthermore, also as an indirect effect, the eddy currents in the pole pieces generate significant heat in the pole pieces and more generally in the magnet system. This in turn may cause variations in the background magnetic field, causing a noise effect in the EPR experiment. Moreover, via heat conduction and/or radiation, this heat may be introduced into the modulation coils in addition to the extra-heating of coils themselves due to unfavorable change of efficiency and inductance, and together into the walls of the microwave resonator. The heat there may cause thermal distortion of the modulation coils and of the microwave resonator assembly, which in turn further causes a detuning type of thermal drift of the resonator, which may lead to unfavorable conditions for the samples to be measured. This heat comes also in form of structural weakening of materials, henceforth the combination of stronger forces and weakening of materials results in stronger acoustic vibrations, which again may increase the noise level in the EPR experiment via the aforementioned mechanism.

In order to minimize eddy currents in the pole pieces, one can set the modulation coils or rapid scan coils at a distance from the pole pieces. In the EPR spectrometer shown in G. Jeschke, see above, the modulation coils are separated from the pole pieces by a significant spacing.

However, in order to do so, it is necessary to provide a relatively large field of view, or here a large air gap, between the pole pieces. When a particular strength and homogeneity of the background magnetic field is desired, increasing the air gap between the poles will require that the size of the magnetic system and, in particular, the size of its permanent or electromagnetic magnets, is significantly increased. Increasing the magnet system will increase its costs by a large amount, though, both in manufacturing and in operation.

U.S. Pat. No. 5,124,651 A describes a human body NMR scanner with a ferromagnetic frame, comprising gradient coils. A plurality of ferromagnetic elements are positioned side by side in polar regions for limiting eddy currents when the gradient coils are energized. The ferromagnetic elements comprise rods with their shortest dimension oriented perpendicular to the pole axis. In another variant, the ferromagnetic elements comprise generally rectangular planar laminations, with their planes generally parallel to the pole axis.

A similar magnetic field generating device used for MRI, applying pole pieces with laminated silicon steel sheets, is known from U.S. Pat. No. 5,283,544 A (also published as EP 0 479 514 A).

U.S. Pat. No. 5,592,089 A describes another NMR imaging system for scanning a human body with ferromagnetic poles equipped with an eddy current suppressing material, having an initial magnetic permeability of more than 1000 and an electrical resistivity of less than 1000 µOhms-cm. The material is to contain magnetic fields generated by pulsed gradients during MR imaging and to suppress the eddy currents generated by this process.

U.S. Pat. No. 5,061,897 A (also published as WO 91/14948 A1) describes a medical NMR scanner, wherein gradient coils are arranged in the polar regions of a means for producing a magnetic field, and a layer of a magnetically permeable, electrically resistive material is positioned in each of said polar regions for limiting eddy current generation said polar regions.

U.S. Pat. No. 6,348,275 A describes a bulk amorphous metal magnetic component that can be used in particular with magnetic resonance imaging systems.

U.S. Pat. No. 6,093,232 discloses a process for making iron-carbon compacts that can be used as magnetic flux concentrators.

SUMMARY OF THE INVENTION

The present invention provides an EPR spectrometer which allows for a compact and inexpensive design while at the same time allowing for EPR measurements low in power consumption and noise level.

This is achieved, in accordance with the invention, by an EPR spectrometer for which each pole piece has a modulation coil or rapid scan coil arranged between said pole piece and the microwave resonator, and for which at least a part of said pole piece facing said modulation coil or rapid scan coil is made of a function material having an electric conductivity $\sigma_f$ of $10^4$ S/m or less, and having a saturation magnetic flux density $BS_f$ of 0.2 T or more.

According to the invention, the invention provides that each pole piece neighboring a modulation coil or rapid scan coil is made from or equipped with a part (also referred to as a surface part) made from a function material. This function material combines a relatively low electric conductivity, roughly lower by a factor of about $10^4$ or more, as compared to a typical iron metal material from which a conventional pole piece is made, and with a high saturation magnetic flux density, roughly being on par with said typical iron metal material. In other words, the function material combines ferromagnetic properties with electric insulator properties.

As a result, eddy currents due to time-varying magnetic fields or corresponding currents in the neighboring modulation coil or rapid scan coil, respectively, are drastically reduced in the function material or, more generally, in the pole piece, as compared to said typical iron metal material.

The relatively low conductivity of the function material in the at least part (or surface part) of the pole piece minimizes the induced eddy currents. The Q-factor (quality) of the modulation coil or rapid scan coil (i.e., the inverse of its total resistance at a given frequency) will be high accordingly, even if said coil is located immediately adjacent to the function material.

At the same time, the pole piece retains its capability of shaping and directing the magnetic field, due to its magnetic permeability or saturation magnetic flux, respectively. Moreover, a modulation coil or rapid scan coil arranged near the function material may fully profit from the magnetic permeability of the function material, in particular for the purpose of achieving a high inductance value L of said coil. Note that, in general, the function material as a whole shows soft magnetic properties.

The reduced amount of current needed for operating the modulation coils or rapid scan coils indirectly reduces the system noise level. The reduced eddy currents in the pole pieces will lower Ohmic heating caused by the pole pieces. Thermal instabilities and thermal deformations in all sections of the EPR spectrometer to where the heat may propagate are reduced, since the total amount of heat generated is reduced. The pole pieces, the remaining magnet system, the modulation coils or rapid scan coils and the microwave resonator will stay cool or at least significantly cooler as compared to using a typical iron metal material for the entire pole pieces located nearby.

Lowering the currents in the modulation coils may also lower acoustic vibrations in the modulation coils directly. Further, eddy currents in the microwave walls caused by the modulation coils may be reduced, which may also help to reduce acoustic vibrations.

All in all, a noise reduction by a factor of 3 to 5, and sometimes up to a factor of 10, can be achieved in practice, as compared to placing a conventional iron pole piece close to the modulation coils or rapid scan coils in an EPR spectrometer.

At the same time, the magnet system can be kept small and therefore is rather inexpensive (both for construction and for operation), since the field of view can be fully used for the probe head including its modulation coils or rapid scan coils. In particular, no significant spacing between the modulation coils or rapid scan coils and the pole piece are necessary in order to minimize losses and noise.

The (at least one) magnet of the magnet system can be a permanent magnet or a resistive coil based magnet (electromagnet). Preferably, the at least one magnet is a permanent magnet or a permanent magnet in combination with resistive sweep coils.

Preferably, the magnet system comprises a pair of magnets (permanent magnets or magnet coils), combined with a pair of pole pieces with function material and a pair of modulation coils or rapid scan coils.

The function material possesses the required low electric conductivity at least within the plane perpendicular to the pole axis. Further, the function material possesses said high saturation magnetic flux at least along the pole axis. Note that typically, the function material is isotropic, i.e. the electric conductivity and saturation magnetic flux are the same irrespective of direction. Note that the function material should be quasi homogenous for the size scale incorporated in the magnet system.

In general, the function material incorporates some structures (e.g., particles) of a (first) ferromagnetic or ferrimagnetic material, causing a sufficient magnetic permeability (in general with $\mu_{rel}$ of at least 100, often at least 500, for low H values, for the overall function material). If this (first) material is electrically conducting (as is the case for ferromagnetic metals), the function material may comprise a second, electrically insulating material, blocking percolation of the structures (e.g., particles) of the first material, thus causing the low electric conductivity for the overall material.

The magnet system typically comprises a ferromagnetic yoke structure, linking the (at least one) magnet with the pole piece or pole pieces. The pole piece or the pole pieces are the end parts of the magnet system which face the field of view or the probe head, respectively. Note that, in the case of a pair of pole pieces, the field of view corresponds to an air gap between the pole pieces; in the case of a single pole piece, the field of view corresponds to an adjacent air space in front of the pole piece. Typically, the pole piece or pole pieces are attached to the yoke structure, e.g., with screws. The pole piece or pole pieces typically have a particular shape in order to homogenize the (background) magnetic field in the field of view. In general, the magnet system typically further comprises at least one, preferably two, sweeping coils, typically wound around the yoke structure, for (slowly) sweeping the magnetic field generated by the magnet system (also called "static field", since the change is slow).

The microwave resonator comprises a cavity enclosed by metallic walls, in which a sample to be measured can be arranged. The microwave resonator is connected to a microwave source for applying a microwave radiation (typically of fixed frequency) to the microwave resonator.

Typically, the probe head comprises two modulation coils or rapid scan coils (or even two modulation coils and two rapid scan coils), arranged symmetrically with respect to the microwave resonator; then each pole piece of a pair of pole pieces faces a modulation coil or rapid scan coil (or both), and at least a part of each pole piece facing the respective modulation coil or rapid scan coil is made from the function material.

If the probe head comprises only one modulation coil or rapid scan coil, then only one pole piece faces a modulation coil or rapid scan coil, and at least a part of only this pole piece, with said part facing the respective modulation coil or rapid scan coil, is made from the function material.

Typically, if the coils must supply the field modulation role for a CW EPR method, the typical arrangement is a parallel LC tuned circuit, with a resonance frequency between 5 kHz and 200 kHz.

Generally, the pole piece or pole pieces face the field of view with basically flat surfaces, which are oriented perpendicular to the pole axis. In case of a pair of opposing pole pieces, the pole axis runs in a straight line from pole piece to pole piece through the field of view. The magnetic field generated by the magnet system, which is aligned with the pole axis, is basically homogeneous (typically with a homogeneity of 100 ppm or better) in the area of the microwave resonator.

In a preferred embodiment of the inventive EPR spectrometer the electrical conductivity $\sigma_f$ is $10^3$ S/m or less, and $BS_f$ is 0.5 T or more. With these characteristics, eddy currents in the pole piece or pole pieces can be reduced even more, and particularly high magnetic field strengths may be established in the field of view.

Preferred is also an embodiment wherein the function material comprises particles of ferromagnetic or ferrimagnetic material dispersed in an electrically insulating matrix material, in particular wherein the function material comprises soft magnetic particles of a ferrite or a metal or a metal alloy dispersed in a polymer matrix material. These materials can combine low electric conductivity and high magnetic permeability and saturation magnetic flux with isotropic characteristics. Electrically insulating matrix materials have an electric conductivity $\sigma_{matrix}$ of $10^4$ S/m or less, preferably $10^3$ S/m or less. Polymers are particularly inexpensive and easy to handle. Soft magnetic material, here of the soft magnetic particles, has a coercive field strength of 1000 A/m or less. The soft magnetic material further typically has a relative magnetic permeability with $\mu_{rel}$ of at least 100 or even at least 500, often with $10<\mu_{rel}<10^5$, or with $100<\mu_{rel}<10^5$.

In an advantageous embodiment, for each pole piece having a modulation coil or rapid scan coil arranged between said pole piece and the microwave resonator, said pole piece is completely made from the function material. This is simple to manufacture, and often allows a superior control of the shaping of the magnetic field in the field of view.

In an alternative, preferred embodiment, for each pole piece having a modulation coil or rapid scan coil arranged between said pole piece and the microwave resonator, only a part of said pole piece facing the modulation coil or rapid scan coil is made from the function material, and a remaining part of the pole piece on which said part is fixed is made from a different material, in particular wherein said different material is a metallic material. This can reduce manufacturing costs in case the function material is expensive. It may also simplify the fixing of the part (surface part) of the pole piece to the remaining part (holder), and altogether the fixing of the pole piece to a yoke structure. In the simplest case, the part (of function material) can be glued onto the remaining part (or holder) of the pole piece.

In a preferred further development of the above embodiment, said part of the pole piece has a thickness T, measured along the pole axis, with T≥0.5 mm, preferably T≥1.0 mm, and/or with T≤12.0 mm, preferably T≤6.0 mm. With these dimensions, a good reduction of the eddy currents can be achieved with a relatively small amount of function material, the latter being often expensive.

In another further development, said part of the pole piece at least overlaps with the complete modulation coil or rapid scan coil in a plane perpendicular to the pole axis, preferably wherein said part of the pole piece reaches beyond the modulation coil or rapid scan coil in the plane perpendicular to the pole axis. In this way, the eddy current reduction in the pole piece is optimized. By overlapping or even reaching beyond the complete microwave resonator in the plane perpendicular to the pole axis with the function material of said part (surface part), the (background) magnetic field can be homogenized in the microwave resonator; material transitions between function material and material of the remaining pole piece have less or no influence on the volume of the microwave resonator.

An advantageous further development provides that said part of the pole piece is an insert held by press fit in a frame structure, in particular a recess, of the remaining part of the pole piece. This is simple to manufacture and is beneficial for achieving a good field homogeneity. The frame structure exerts a clamping force onto the insert, such that it is held in the frame structure. The clamping force is in general within a plane perpendicular to the pole axis and compresses the insert. Typically, the pole piece forms a recess with a closed circumferential edge surrounding said part of functional material. Preferably, the remaining pole piece is flush with the insert. Alternatively, the frame structure only comprises a plurality of mutually opposing frame elements (projections) clamping the insert.

In another further development, said part of the pole piece is glued onto the remaining part of the pole piece. This is particularly simple to do.

A preferred further development provides that the remaining part of the pole piece, but not said part of the pole piece, comprises one or a plurality of openings through which a respective screw projects, with the screw being screwed into a yoke structure or a permanent magnet of the magnet system. A screw connection is particularly reliable and robust. The openings for the screw are only needed in the remaining part here, and not in the part (surface part) made of the function material, so brittle function materials can be used without difficulty.

In a preferred embodiment, each modulation coil or rapid scan coil is fixed to the pole piece it faces. This way, the modulation coil or rapid scan coil can be brought very close to the pole piece, thus optimizing the use of the space in close vicinity to the pole piece best suited for EPR measurement, in particular between two opposing pole pieces (field of view or "air gap"). Alternatively, all modulation coils or rapid scan coils can be fixed to the microwave resonator.

Preferred is also an embodiment wherein the EPR spectrometer comprises a pair of mutually opposing pole pieces and the field of view has a width WAG along the pole axis, with 10 mm≤WAG≤100 mm, preferably 20 mm≤WAG≤60 mm. This compact design can be used in accordance with the invention, without running the risk of inducing significant eddy currents in the pole piece, therefore with low power consumption and low noise level.

Particularly preferred is an embodiment wherein for a distance DPC along the pole axis between a respective pole piece and a modulation coil or rapid scan coil it faces, the following applies: 0≤DPC≤2.0 mm, preferably 0≤DPC≤1.0 mm, particularly preferably 0≤DPC≤0.5 mm. These small distances allow an efficient use of the space of the field of view, without causing significant eddy currents by the modulation or rapid scan coils in the pole pieces.

Also within the scope of the present invention is the use of an inventive EPR spectrometer as described above in an EPR measurement, wherein a sample is arranged in the microwave resonator, wherein the magnet system generates a magnetic field in the field of view along the pole axis, and wherein the at least one modulation coil or rapid scan coil generates a time-varying, additional magnetic field in the field of view along the pole axis, in particular with a frequency between 5 kHz and 200 kHz. The additional magnetic field in the field of view will cause no or only insignificant eddy currents in the pole piece or pole pieces, resulting in low power consumption and low noise level.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

DETAILED DESCRIPTION

Figure 1:
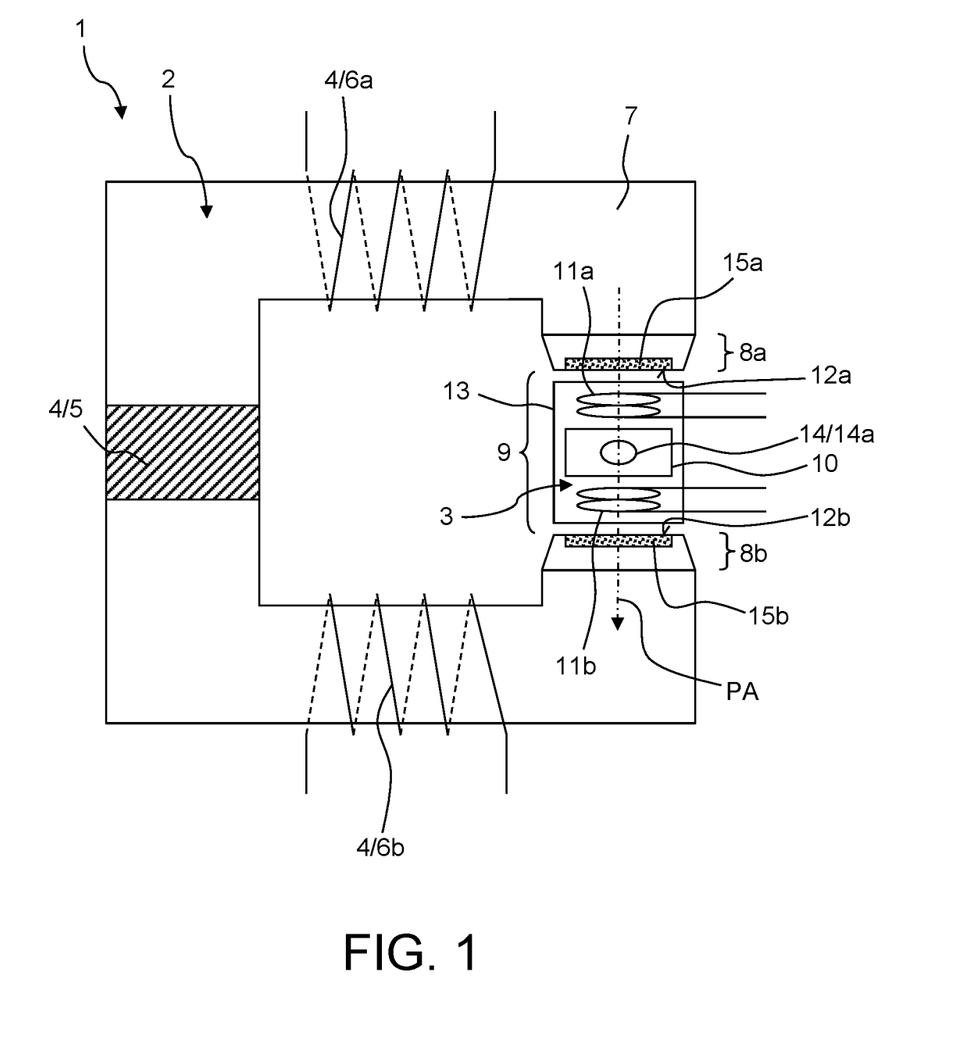
FIG. 1 shows a schematic cross-section of a first embodiment of an inventive EPR spectrometer, having a pair of modulation coils.

FIG. 1 schematically illustrates a first embodiment of an inventive EPR spectrometer 1. The EPR spectrometer 1 comprises a magnet system 2 and a probe head 3.

The magnet system 2 here comprises three magnets 4, namely a permanent magnet 5 and two electromagnets 6a, 6b. The magnet system 2 further comprises a yoke structure 7 made from a ferromagnetic material, typically based on an iron alloy, and having roughly a C shape, for guiding and enhancing the magnetic flux generated. The yoke structure can alternatively be shaped as a window frame, a pot core or any other suitable structure (not shown). The electromagnets 6a, 6b or their windings, respectively, are arranged on the upper and lower arm of the yoke structure 7 here. At the opposing ends of the yoke structure 7, in FIG. 1 on the right-hand side, the yoke structure 7 is equipped with pole pieces 8a, 8b.

The permanent magnet 5 is here integrated into the back (in FIG. 1 on the left-hand side) of the yoke structure 7.

The magnet system 2 generates a magnetic field (also called background magnetic field or static magnetic field or B0 field) in a field of view 9 between the pole pieces 8a, 8b, which corresponds here to an air gap between the mutually opposing pole pieces 8a, 8b. The magnetic field in the field of view 9 is aligned with a pole axis PA, which runs here vertically and perpendicular to the surfaces 12a, 12b of the pole pieces 8a, 8b facing the field of view 9 ("inner surfaces" 12a, 12b). The electromagnets 6a, 6b may be used to slowly alter (or "sweep") the magnetic field during an EPR measurement by appropriate electric current control; accordingly, the electromagnets 6a, 6b are also referred to as sweeping coils.

In the field of view 9, there is arranged the probe head 3, which here comprises a microwave resonator 10, a pair of modulation coils 11a, 11b, and here also a housing 13 containing the microwave resonator 10 and the modulation coils 11a, 11b. Inside the microwave resonator 10, which has metallic walls, a sample volume 14 for arranging a sample 14a to be measured is arranged. Microwave radiation (also called B1 field) can be coupled into and out of the microwave resonator 10, typically via a waveguide attached to a microwave source and a microwave detector (not shown here, for simplification).

In the embodiment shown, between each of the pole pieces 8a, 8b and the microwave resonator 10, there is arranged one of the modulation coils 11a, 11b. The pair of modulation coils 11a, 11b may generate an additional, time-varying magnetic field along the pole axis PA, at least in the sample volume 14.

Further, in the embodiment shown, a part 15a, 15b of each pole piece 8a, 8b facing a modulation coil 11a, 11b is made from a function material (illustrated with a dotted shading) having a low electric conductivity (e.g., with $\sigma_f = 10^2$ S/m) and having a high saturation magnetic flux density (e.g. with $BS_f$ of 0.5 T).

The parts 15a, 15b of the function material prevent or at least minimize the induction of eddy currents in the pole pieces 8a, 8b caused by the time-varying magnetic fields generated by modulation coils 11a, 11b. Note that induced eddy currents would generate not only Ohmic losses, decreasing the efficiency of LC tank, but also magnetic fields opposed to the time-varying magnetic field that caused them, hence decreasing coils' inductance. As a double consequence of the application of the function material, since losses caused by the eddy currents in pole materials are prevented or minimized and only the inductance of coils is favorably increased, the electric currents in the modulation coils 11a, 11b can be chosen relatively small in order to achieve a desired strength of the time varying magnetic field at the EPR sample position, what reduces power consumption with a factor of square. The first important result is that the acoustical vibrations energy, due to currents in the coils 11a, 11b, and the Ohmic loss as thermal energy in the pole pieces 8a, 8b and the coils 11a, 11b are reduced as well, which lead to a favorable decreasing the noise of the EPR measurements on the sample 14a. The second important result is that the modulation coils 11a, 11b can be placed close to the pole pieces 8a, 8b in a compact design of the EPR spectrometer 1, and obtain a higher performance vs. cost score.

It should be noted that instead or in addition to the modulation coils 11a, 11b, also rapid scan coils can be employed, in accordance with the invention; the above description applies in analogous way then.

Figure 2:
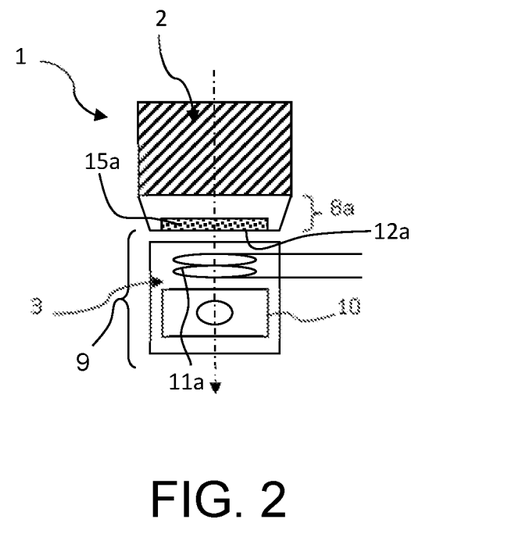
FIG. 2 shows a schematic cross-section of a second embodiment of an inventive single-sided EPR spectrometer, having one pole piece and a single modulation coil.

In FIG. 2, a second embodiment of an inventive EPR spectrometer 1 is shown, which is a single sided EPR spectrometer. This embodiment comprises a magnet system 2 generating a magnetic field in the probe head 3 from only one side of the field of view 9, here from the top side. An arrangement of a magnet system 2 on only one side of the probe head 3 is useful in very compact EPR devices such as chip-based EPR sensors.

In the embodiment of FIG. 2, the probe head 3 comprises only one modulation coil 11a, here arranged above the microwave resonator 10. In this case, it is sufficient to equip the only one pole piece 8a arranged on the top side with the part 15a of function material. The magnet system 2 can be comprised of an electromagnet or a permanent magnet combined with a sweep coil for CW applications.

It is however possible to arrange a second pole piece (not shown) on the opposite side of pole piece 8a which is made entirely of conventional iron metal material which has a high electric conductivity ($>>10^4$ S/m). The arrangement of a second pole piece will increase the magnetic field homogeneity in the field of view 9. It is also possible that the magnet system 2 is equipped with a yoke structure for returning the magnetic field to the magnet. Said opposite second pole piece (not shown) is separated from the modulation coil 11a in the direction of the pole axis PA at least by the thickness of the microwave resonator 10, so the local strength of the time varying magnetic field generated by the modulation coil 11a is generally much lower at the surface of the opposite second pole piece as compared to the surface 12a of the pole piece 8a.

Figure 3A:
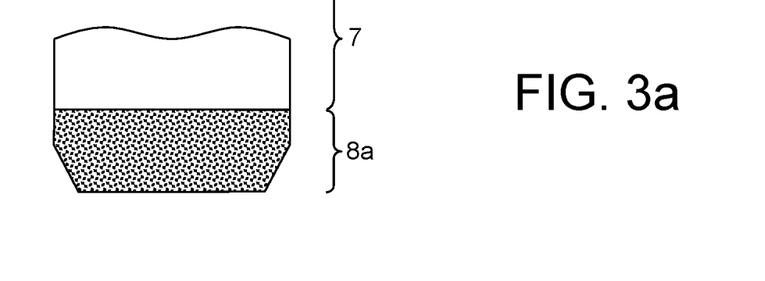
FIG. 3a shows a schematic cross-section of a pole piece for the invention, attached to a yoke structure by gluing, with the pole piece being completely made from the function material.

FIG. 3a illustrates a first type of pole piece 8a for use with the invention, for example in an EPR spectrometer as shown in FIG. 1. In the type shown, the pole piece 8a is entirely made from the function material (illustrated with a dotted shading, as used in other figures). The pole piece 8a is here glued to an end of the yoke structure 7.

Figure 3B:
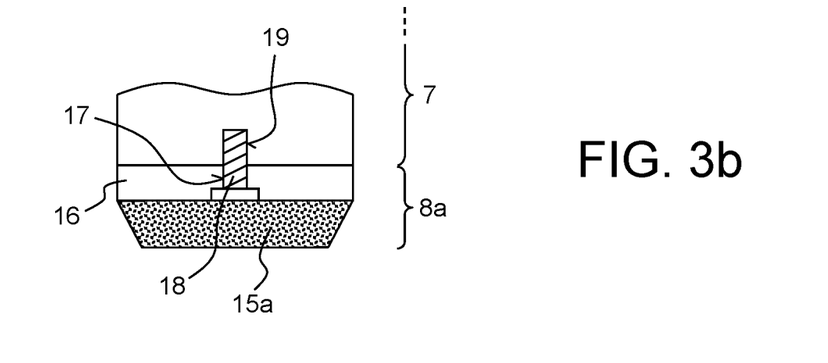
FIG. 3b shows a schematic cross-section of a pole piece for the invention, attached to a yoke structure by screwing, with the pole piece comprising a part of function material glued to a remaining part of the pole piece made of iron.

FIG. 3b illustrates a second type of a pole piece 8a for use with the invention, for example in an EPR spectrometer as shown in FIG. 1. Here, the pole piece 8a comprises a part 15a made from the function material, and a remaining part 16 (also called holder) is made from a soft magnetic metal material, here iron. The part 15a made of the function material is glued onto the remaining part 16. The remaining part 16 of the pole piece 8a comprises an opening 17 through which a screw 18 projects. The screw 18 is screwed into a thread 19 located in a yoke structure 7.

Figure 3C:
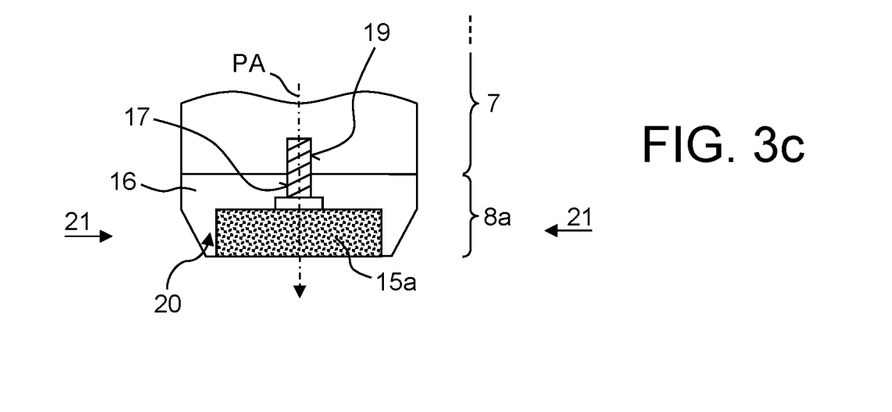
FIG. 3c shows a schematic cross-section of a pole piece for the invention, attached to a yoke structure by screwing, with the pole piece comprising a part of function material clamped into a recess of a remaining part of the pole piece made of iron.

FIG. 3c illustrates a third type of a pole piece 8a for use with the invention, for example in an EPR spectrometer as shown in FIG. 1. Here, the pole piece 8a comprises a part 15a made from the function material, and a remaining part 16 (also called holder) is made from a soft magnetic metal material, here iron. The remaining part 16 forms a frame structure 20, here with a recess having a circumferential edge, into which the part 15a has been pressed. Accordingly, the frame structure 20, which can be spread elastically to some degree, exerts some pressure onto the part 15a in a clamping direction 21, which is perpendicular to the pole axis PA. The remaining part 16 of the pole piece 8a again comprises an opening 17 through which a screw 18 projects. The screw 18 is screwed into a thread 19 located in a yoke structure 7. The part 15a covers here the screw 19 and the opening 17.

Figure 4A:
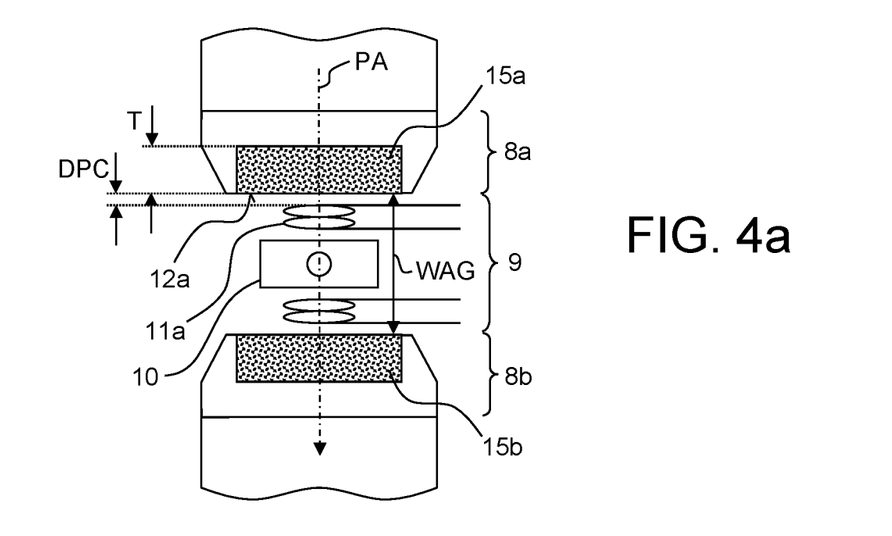
FIG. 4a shows a schematic cross-section of the field of view area of an inventive EPR spectrometer, with a pair of modulation coils arranged at a short distance from the parts of function material of the pole pieces.

FIG. 4a illustrates the area of the field of view 9 of an inventive EPR spectrometer by way of example, similar to the embodiment shown in FIG. 1. In the example shown, in the direction of the pole axis PA, there is a non-zero distance DPC between the pole piece 8a and the modulation coil 11a it faces. Typically, this distance DPC is 2 mm or less. The distance DPC can be measured between the flat surface 12a of the pole piece 8a or its part 15a, and the part of the modulation coil 11a projecting farthest towards the pole piece 8a. Further, the part 15a made of the function material has a thickness T, measured along the pole axis PA. The thickness T is typically in the range of 1 mm through 6 mm. Such a thickness T is enough to reliably block eddy currents in the pole piece 8a.

It should be noted that in the direction perpendicular to the pole axis PA, the part 15a reaches beyond the modulation coil 11a, and here also reaches beyond the microwave resonator 10. The width WAG of the field of view 9 (i.e., here of the air gap between the pole pieces 8a, 8b) along the pole axis PA is typically in a range of 10 mm≤WAG≤100 mm, preferably in a range of 20 mm≤WAG≤60 mm.

Figure 4B:
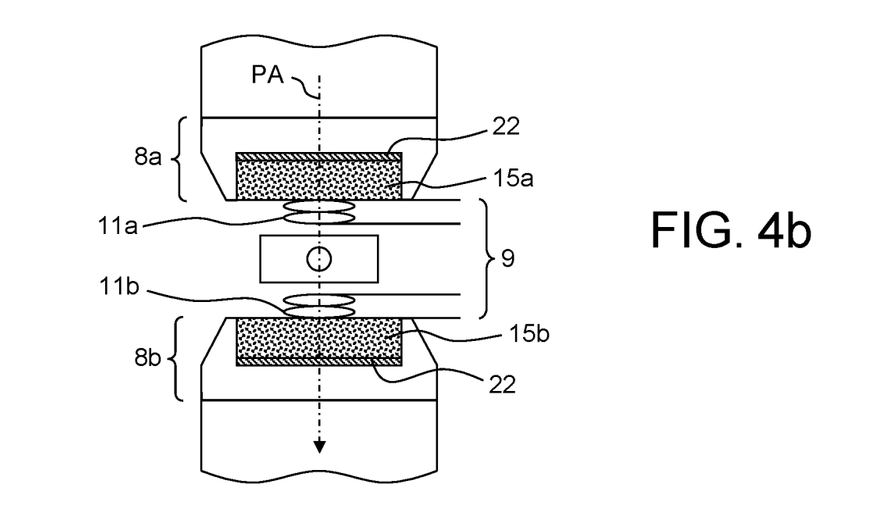
FIG. 4b shows a schematic cross-section of the field of view area of an inventive EPR spectrometer, with a pair of modulation coils directly attached to the parts of function material of the pole pieces.

FIG. 4b illustrates the area of the field of view 9 of an inventive EPR spectrometer in another of example. In the example shown, the modulation coils 11a, 11b are directly attached to the pole pieces 8a, 8b. In other words, the distance along the pole axis PA between the pole pieces 8a, 8b and the modulation coils 11a, 11b they are facing is zero. This results in a very compact magnet system design.

As another particularity, in the example shown, on the back side of each part 15a, 15b made of function material, there is attached a foil 22 of a highly conductive material, such as copper, for example with an electrical conductivity of $10^7$ S/m or more. In this way, remaining eddy currents in the pole piece 8a can be trapped in a defined way, in particular located at a distance relatively far from the modulation coils 11a, 11b. Therefore, in general, a layer of highly conductive material having an electric conductivity of $10^7$ S/m or more can be arranged on a side of at least the part 15a, 15b of the pole piece 8a, 8b facing away from a modulation coil 11a, 11b or rapid scan coil, in accordance with the invention, in particular wherein the layer comprises a foil 22 made e.g., of copper.

Figure 5A:
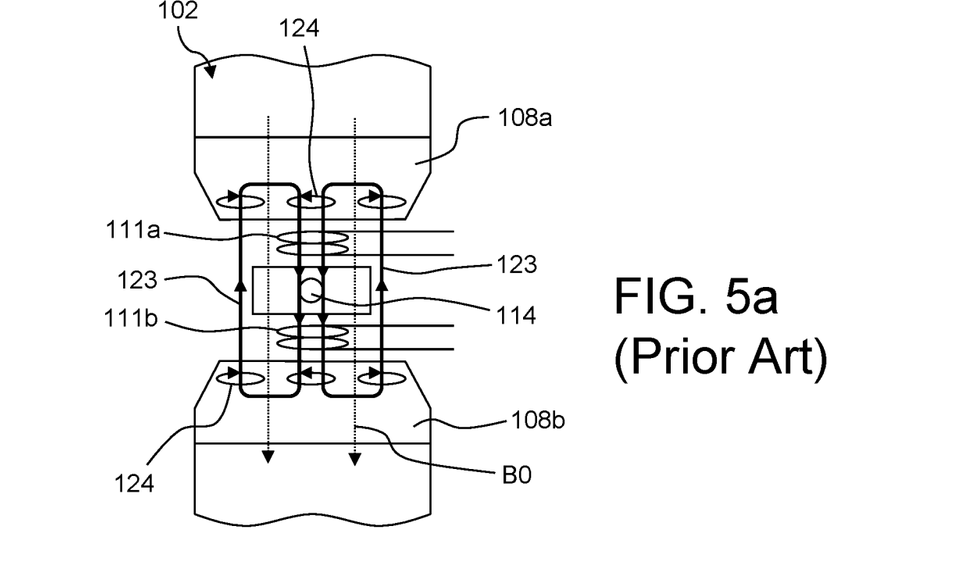
FIG. 5a shows a schematic cross-section of the field of view region of an EPR spectrometer if iron metal pole pieces are used with short distance to the pole pieces (different from the invention).

In FIG. 5a, the region of the field of view of an EPR spectrometer similar to the one shown in FIG. 1 is shown, wherein the pole pieces 108a, 108b are not equipped with function material in accordance with the invention, but conventional iron material pole pieces 108a, 108b are used. The magnet system 102 generates a background field B0, which is to be superimposed by a time varying magnetic field 123 generated by the modulation coils 111a, 111b.

When using conventional iron material pole pieces 108a, 108b at the ends of a magnetic system 102, the time-varying magnetic fields 123 generated by the modulation coils 111a, 111b induce eddy currents 124 in the pole pieces 108a, 108b nearby. The eddy currents 124 generate local magnetic fields which are opposed to the time-varying magnetic field 124, so the electric current strength in the modulation coils 111a, 111b must be increased in order to achieve a desired field strength at least in the sample volume 114. Further, the pole pieces 108a, 108b become warm by Ohmic heating, and the heat may spread over the entire setup, in particular into the modulation coils 111a, 111b and the microwave resonator 110, detuning them.

Figure 5B:
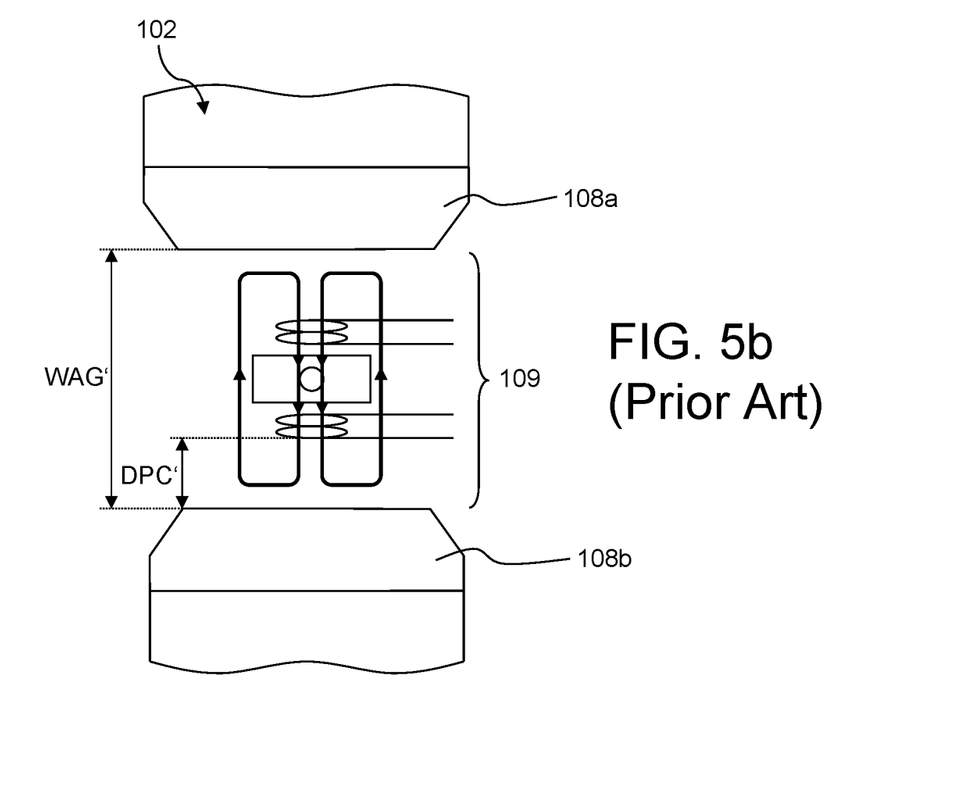
FIG. 5b shows a schematic cross-section of the field of view region of an EPR spectrometer if iron metal pole pieces are used with long distance to the pole pieces (state of the art).

In order to avoid the eddy currents in the pole pieces 108a, 108b, one may increase the width WAG' of the field of view 109 and locate the pole pieces 108a, 108b at a larger distance DPC' from the modulation coils 111a, 111b, as shown in FIG. 5b. However, in order to achieve the same magnetic field strength in the field of view 109 as before, it is then in general necessary to use a larger magnetic system 102 than before, which increases the costs for the EPR spectrometer considerably.

In order to demonstrate the benefits of the present invention, a resonant circuit with a capacitor and a modulation has been prepared, and the modulation coil has been brought into the vicinity of a conventional iron metal material pole piece or a pole piece made (entirely) from function material, as it is an option of the invention. As function material, an epoxy resin with non-percolating iron metal particulate inclusions has been used (electrical resistivity $0.5*10^4$ Ohm*cm, saturation magnetic flux 2.03 T).

Figure 6:
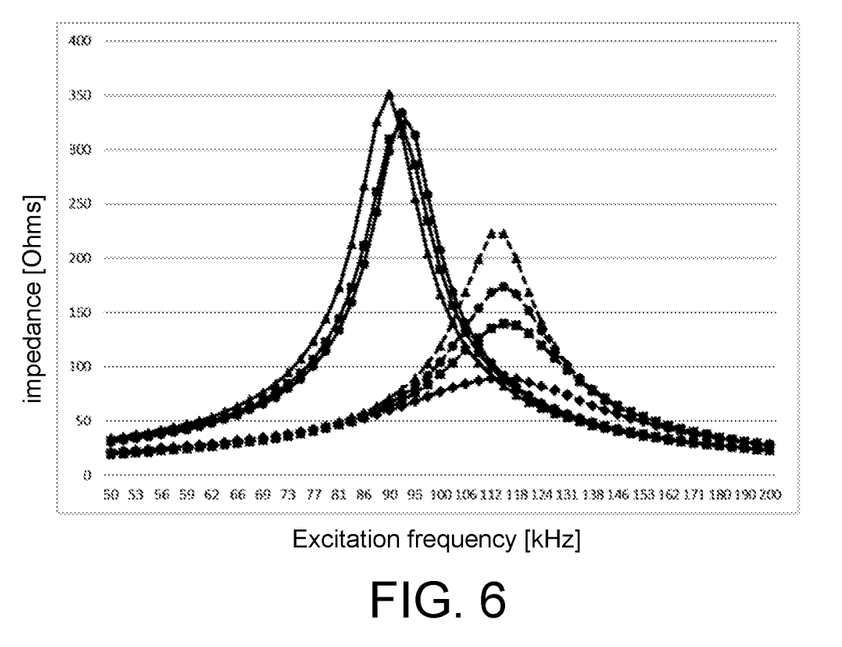
FIG. 6 shows a diagram illustration of the impedance (Ohms) vs. excitation frequency, and the resonance frequency in a circuit comprising a modulation coil and a capacitor, applying neighboring conventional iron metal pole pieces (dashed curves) and pole pieces made of function material in accordance with the invention (full curves), for different distances of the modulation coil from a pole piece; the various curve labels indicate the distance separating the coil to the pole material.

FIG. 6 plots the measured impedance of the resonant circuit at the upright axis (in Ohms) as a function of the excitation frequency in kHz on the rightward axis. The dashed lines show the results using the conventional iron pole piece, and the full lines show the results for the pole piece made of the function material in accordance with the invention. The distance of the modulation coil to the pole piece was 0 mm for the lines marked with diamonds, 2.5 mm for those marked with squares, 4 mm for those marked with circles, and 6 mm for those marked with triangles.

As can be seen in FIG. 6, for the iron pole piece, the resonance curves (on the right side) become flatter when the distance becomes smaller. This is a strong sign of increasing dampening by eddy currents in the iron pole piece when the distance becomes smaller. On the other hand, for pole piece made of function material (on the left side), the resonant curves are all sharp and practically independent from the distance.

The inductances of the modulation coils are influenced by the material nearby. Material allowing considerable eddy currents located nearby tends to lower the inductance, whereas material with ferromagnetic permittivity tends to increase the inductance. For the experiment with iron pole piece, these two effects cancelled each other out to a large extent, whereas for experiments with pole pieces equipped with the function material, the inductance was significantly increased. As a result, the resonance frequencies for the experiments using pole pieces with the function material are significantly lower as compared to the experiments with the iron pole pieces (at about 115 kHz for the conventional pole piece and about 90 kHz for the inventive pole piece). Then the Q-factors were determined for the resonant curves of FIG. 6. A low Q-factor directly indicates a strong dampening and vice versa.

Figure 7:
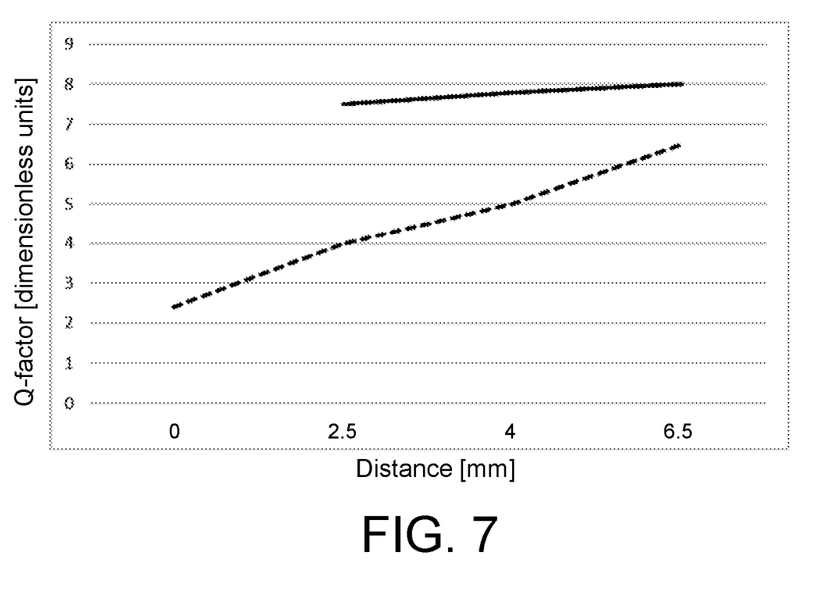
FIG. 7 shows a diagram illustrating the Q-factor (indicative of losses in pole material) of the modulation coil of the resonant circuits of FIG. 6 using conventional iron metal pole pieces (dashed curves) and pole pieces made of function material (full curves) as a function of the distances of the modulation coil from the pole piece.

In FIG. 7, the Q-factor (dimensionless value) is plotted to the vertical axis, and the horizontal axis plots the distance (in mm) of the modulation coil to the pole piece in each case. The Q-factor can be determined with $Q=f0/\Delta f$, with f0: resonance frequency (location of the maximum amplitude in the resonance curve) and $\Delta f$: width of the resonance curve at an attenuation of 3 dB with respect to the maximum. For the conventional Fe pole piece setup (dashed line), the Q-factor is strongly dependent on the distance, and increases from about 2.5 at distance zero to about 6.5 at a distance of 6.5 mm. In contrast, for the pole piece of the function material, the Q-factor is roughly constant between 7.5 and 8 for all investigated distances.

Figure 8:
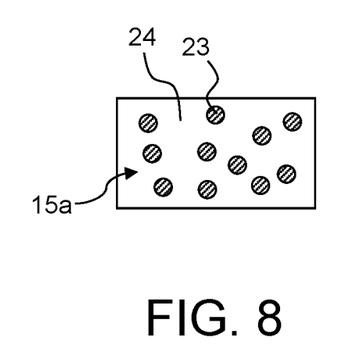
FIG. 8 shows a schematic cross section of a section of a part of a pole piece for the invention, made from the function material.

FIG. 8 illustrates the function material in a part 15a of a pole piece, comprising a plurality of particles 23 of a ferromagnetic or ferrimagnetic material, e.g., iron, distributed in an electrically insulating matrix material 24, e.g., made from a polymer, such as polymeric resin. The particles 23 do not percolate, i.e., they do not build chains of touching particles 23 but, rather, are isolated from each other by the matrix material 24. Accordingly, the electrical conductivity of the matrix material 24 dominates the electric conductivity of the function material. However, the particles 23 may contribute to the overall magnetic permeability of the function material, proportional to their proportion in the function material. With the particles 23 being distributed homogenously in the matrix material 24, the function material exhibits isotropic electric and magnetic properties.

The invention claimed is:

1. An electron paramagnetic resonance (EPR) spectrometer comprising:
    a magnet system comprising at least one magnet and at least one pole piece for producing a magnetic field in a field of view in front of the at least one pole piece, said magnetic field being generated along a pole axis; and
    a probe head comprising a microwave resonator and at least one modulation coil or rapid scan coil for producing an additional, time-varying magnetic field aligned along the pole axis that has a frequency between 5 KHz and 200 KHz in an EPR measurement, wherein the probe head is arranged in the field of view, and wherein a respective modulation coil or rapid scan coil is arranged between the microwave resonator and a respective pole piece;
    wherein
        for each pole piece having a modulation coil or rapid scan coil arranged between said pole piece and the microwave resonator, at least a first part of said pole piece facing said modulation coil or rapid scan coil is made of a function material having an electric conductivity $\sigma_f$ of $10^4$ S/m or less, and having a saturation magnetic flux density $BS_f$ of 0.2 T or more and each modulation coil or rapid scan coil is fixed to the pole piece it faces; and
    for a distance DPC along the pole axis between a respective pole piece and a modulation coil or rapid scan coil it faces, the following applies: $0 \leq DPC \leq 2.0$ mm.

2. An EPR spectrometer according to claim 1, wherein $\sigma_f$ is $10^3$ S/m or less, and that $BS_f$ is 0.5 T or more.

3. An EPR spectrometer according to claim 1, wherein the function material is isotropic.

4. An EPR spectrometer according to claim 1, wherein the function material comprises particles of ferromagnetic or ferrimagnetic material dispersed in an electrically insulating matrix material.

5. An EPR spectrometer according to claim 4, wherein the function material comprises soft magnetic particles of a ferrite or a metal or a metal alloy dispersed in a polymer matrix material.

6. An EPR spectrometer according to claim 1 wherein, for each pole piece having a modulation coil or rapid scan coil arranged between said pole piece and the microwave resonator, said pole piece is completely made from the function material.

7. An EPR spectrometer according to claim 1 wherein, for each pole piece having a modulation coil or rapid scan coil arranged between said pole piece and the microwave resonator, the first part of said pole piece facing the modulation coil or rapid scan coil is made from the function material, and a remaining part of the pole piece is made from a different material.

8. An EPR spectrometer according to claim 7, wherein said different material is a metallic material.

9. An EPR spectrometer according to claim 7, wherein the first part of the pole piece has a thickness T, measured along the pole axis, with $T \geq 0.5$ mm, and/or with $T \leq 12.0$ mm.

10. An EPR spectrometer according to claim 7, wherein the first part of the pole piece at least partially overlaps with the complete modulation coil or rapid scan coil in a plane perpendicular to the pole axis.

11. An EPR spectrometer according to claim 7, wherein the first part of the pole piece extends beyond the modulation coil or rapid scan coil in the plane perpendicular to the pole axis.

12. An EPR spectrometer according to claim 7 wherein the first part of the pole piece is an insert held by press fit in a frame structure of the remaining part of the pole piece.

13. An EPR spectrometer according to claim 7 wherein the first part of the pole piece is glued onto the remaining part of the pole piece.

14. An EPR spectrometer according to claim 7, wherein the remaining part of the pole piece, but not the first part of the pole piece, comprises one of a plurality of openings through which a respective screw projects, with the screw being screwed into a yoke structure or a permanent magnet of the magnet system.

15. An EPR spectrometer according to claim 1, wherein the EPR spectrometer comprises a pair of mutually opposing pole pieces and the field of view has a width WAG along the pole axis, with 10 mm $\leq$ WAG $\leq$ 100 mm.

16. An EPR spectrometer according to claim 1, wherein said pole piece is one of a pair of pole pieces.

17. Use of an EPR spectrometer according to claim 1, wherein a sample is arranged in the microwave resonator, wherein the magnet system generates a magnetic field in the field of view along the pole axis, and wherein the at least one modulation coil or rapid scan coil generates a time-varying, additional magnetic field in the field of view along the pole axis.

* * * * *